(12) United States Patent
Ebizuka et al.

(10) Patent No.: US 9,543,113 B2
(45) Date of Patent: Jan. 10, 2017

(54) CHARGED-PARTICLE BEAM DEVICE FOR IRRADIATING A CHARGED PARTICLE BEAM ON A SAMPLE

(71) Applicant: Hitachi High-Technologies Corporation, Minato-ku, Tokyo (JP)

(72) Inventors: Yasushi Ebizuka, Tokyo (JP); Seiichiro Kanno, Tokyo (JP); Naoya Ishigaki, Tokyo (JP); Masashi Fujita, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/759,241

(22) PCT Filed: Jan. 10, 2014

(86) PCT No.: PCT/JP2014/050267
§ 371 (c)(1),
(2) Date: Jul. 6, 2015

(87) PCT Pub. No.: WO2014/112428
PCT Pub. Date: Jul. 24, 2014

(65) Prior Publication Data
US 2015/0357156 A1    Dec. 10, 2015

(30) Foreign Application Priority Data
Jan. 17, 2013 (JP) ................. 2013-005879

(51) Int. Cl.
*H01L 21/00* (2006.01)
*H01J 37/20* (2006.01)
(Continued)

(52) U.S. Cl.
CPC ............. *H01J 37/20* (2013.01); *H01J 37/026* (2013.01); *H01J 37/09* (2013.01); *H01J 37/28* (2013.01); *H01J 2237/2007* (2013.01)

(58) Field of Classification Search
CPC .. H01L 21/6833; H01L 21/6831; H01L 22/14; H01L 22/26; H01L 37/32935; H01L 37/20; H01L 37/32174
(Continued)

(56) References Cited

U.S. PATENT DOCUMENTS 5,184,398 A * 2/1993 Moslehi ............. C23C 16/4583
                                                       257/E21.531
5,436,790 A * 7/1995 Blake .................. H01L 21/6831
                                                       361/234
(Continued)

FOREIGN PATENT DOCUMENTS

JP     2-117131 A      5/1990
JP     2000-234973 A   8/2000
(Continued)

OTHER PUBLICATIONS

International Search Report dated Mar. 4, 2014 with an English translation (four (4) pages).

*Primary Examiner* — David A Vanore
(74) *Attorney, Agent, or Firm* — Crowell & Moring LLP

(57) ABSTRACT

The present invention explains a charged-particle beam device for the purpose of highly accurately measuring electrostatic charge of a sample in a held state by an electrostatic chuck (105). In order to attain the object, according to the present invention, there is proposed a charged-particle beam device including an electrostatic chuck (105) for holding a sample on which a charged particle beam is irradiated and a sample chamber (102) in which the electrostatic chuck (105) is set. The charged-particle beam device includes a potential measuring device that measures potential on a side of an attraction surface for the sample of the electrostatic chuck (105) and a control device that performs potential measurement by the potential (Continued)

measuring device in a state in which the sample is attracted by the electrostatic chuck (105).

6 Claims, 5 Drawing Sheets

(51) Int. Cl.
*H01J 37/02* (2006.01)
*H01J 37/28* (2006.01)
*H01J 37/09* (2006.01)

(58) Field of Classification Search
USPC ............... 250/307, 309, 310, 311, 442.11; 324/756.01, 762.05
See application file for complete search history.

(56) References Cited

U.S. PATENT DOCUMENTS

| | | | |
|---|---|---|---|
| 6,215,640 B1* | 4/2001 | Hausmann | H01L 21/6833 361/115 |
| 6,946,656 B2 | 9/2005 | Ezumi et al. | |
| 7,309,997 B1* | 12/2007 | Radovanov | H01J 37/304 324/762.05 |
| 7,655,907 B2* | 2/2010 | Tanimoto | H01J 37/265 250/307 |
| 8,111,499 B2* | 2/2012 | Ni | H01L 21/6833 361/234 |
| 2002/0173059 A1* | 11/2002 | Ma | H01J 37/32935 438/17 |
| 2006/0056131 A1* | 3/2006 | Tanimoto | G03F 7/2059 361/234 |
| 2008/0006781 A1 | 1/2008 | Kitahara | |
| 2009/0084169 A1* | 4/2009 | Bailey, III | H01L 22/20 73/104 |
| 2010/0327873 A1* | 12/2010 | Dorf | H01J 37/3299 324/464 |
| 2015/0002018 A1* | 1/2015 | Lill | H01J 37/32146 315/111.21 |
| 2015/0357156 A1* | 12/2015 | Ebizuka | H01J 37/28 250/311 |

FOREIGN PATENT DOCUMENTS

| | | |
|---|---|---|
| JP | 2002-532877 A | 10/2002 |
| JP | 2004-172487 A | 6/2004 |
| JP | 2006-19301 A | 1/2006 |
| JP | 2006-108643 A | 4/2006 |
| WO | WO 2005/124467 A1 | 12/2005 |

* cited by examiner

CHARGED-PARTICLE BEAM DEVICE FOR IRRADIATING A CHARGED PARTICLE BEAM ON A SAMPLE

TECHNICAL FIELD

The present invention relates to a charged-particle beam device that irradiates a charged particle beam such as an electron beam on a sample and, more particularly, to a charged-particle beam device that irradiates a charged particle beam on a sample held by an electrostatic chuck.

BACKGROUND ART

A scanning electron microscope, which is a form of a charged-particle beam device, is an device that detects secondary electrons or the like obtained by irradiating an electron beam on a sample to thereby perform an image formation, measurement of a pattern, a defect test, and the like. According to refining of semiconductor devices and the like in recent years, importance of the scanning electron microscope tends to further increase. As a mechanism for holding a semiconductor wafer, which is an irradiation target of an electron beam, an electrostatic chuck is known. The electrostatic chuck is a holding mechanism capable of firmly holding a wafer and suitable for an increase in speed and an increase in accuracy of an device.

PTL 1 mentions that, in order to suppress electrostatic breakdown and the like of a sample, an ultraviolet beam source for irradiating an ultraviolet beam on the sample is provided in a sample chamber. PTL 2 describes a mechanism for measuring an amount of electrostatic charge in advance with a surface potential sensor before a wafer is conveyed to a sample chamber.

CITATION LIST

Patent Literature

PTL 1: JP-A-2-117131
PTL 2: JP-A-2006-19301 (corresponding to U.S. Pat. No. 6,946,656)

SUMMARY OF INVENTION

Technical Problem

Various performance improvement effects can be expected by applying an electrostatic chuck to, in particular, a scanning electron microscope that performs measurement and inspection of semiconductors for which high throughput is requested in these days. However, problems due to characteristics of the electrostatic chuck are also present. For example, a surface of the electrostatic chuck for holding a wafer is covered with ceramics having high electric insulation. Therefore, electrostatic charge is caused by contact and friction between the wafer and the electrostatic chuck and accumulates on the electrostatic chuck as residual charges. The accumulated residual charges are likely to not only cause a focus blur of an acquired image but also cause a residual attraction force, leading to deterioration in throughput and a conveyance error. The electrostatic charge caused by the contact and the friction can be suppressed by reducing an amount of friction and an attraction force of the wafer. However, the electrostatic charge cannot be completely eliminated.

PTL 1 does not include disclosure concerning suppression of the electrostatic charge due to the electrostatic chuck. The electrostatic charge of the wafer itself can be measured in advance by the surface potential sensor before the wafer is conveyed to the sample chamber as explained in PTL 2. However, the influence due to a conduction state of the wafer rear surface is not determined before the wafer is placed on the electrostatic chuck. Therefore, the surface potential of the wafer in a held state by the electrostatic chuck cannot be accurately predicted.

A charged-particle beam device for the purpose of highly accurately measuring electrostatic charge of a sample in a held state by an electrostatic chuck is explained below.

Solution to Problem

As an aspect for attaining the object, there is proposed below a charged-particle beam device including an electrostatic chuck mechanism for holding a sample on which a charged particle beam is irradiated and a sample chamber in which the electrostatic chuck is set. The charged-particle beam device includes: a potential measuring device that measures potential on a side of an attraction surface for the sample of the electrostatic chuck mechanism; and a control device that performs potential measurement by the potential measuring device in a state in which the sample is attracted by the electrostatic chuck mechanism.

Advantageous Effect of Invention

With the configuration explained above, it is possible to highly accurately measure electrostatic charge of the sample held by the electrostatic chuck and, as a result, perform highly accurate adjustment of device conditions of the charged-particle beam device.

DESCRIPTION OF EMBODIMENTS

Figure 1:
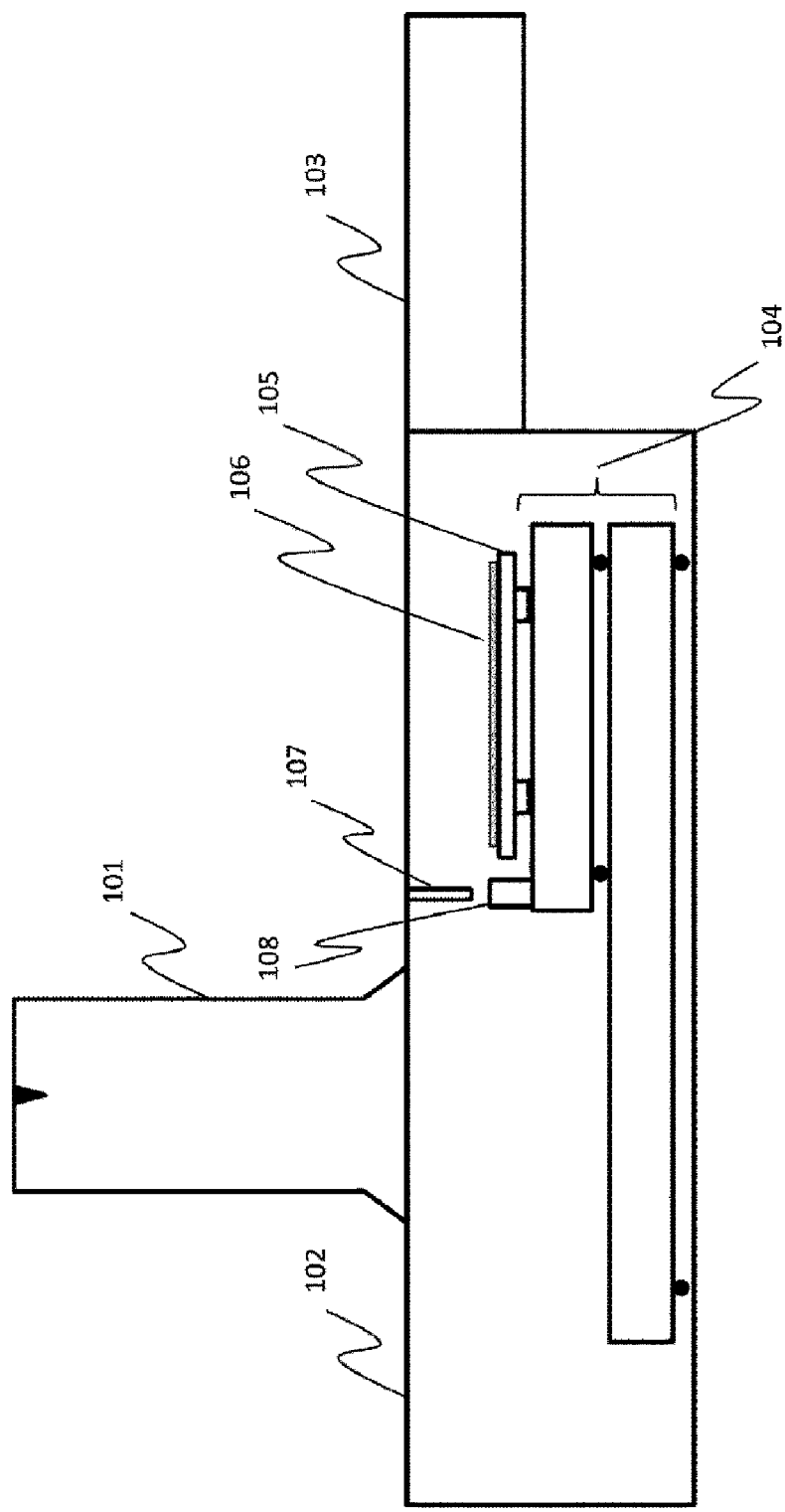
FIG. 1 is a diagram showing an overview of a scanning electron microscope for semiconductor measurement.

In recent years, an electron microscope is applied to dimension measurement of a semiconductor device pattern and a defect test. For example, a length measuring SEM (Critical-Dimension Scanning Electron Microscope, hereinafter, CD-SEM) is used for measurement of a gate dimension of a semiconductor device. A defect test SEM is used for the defect test. A scanning electron microscope is also used for a conduction test of deep holes for wiring making use of potential contrast.

As an example, a basic principle of measurement is briefly explained with reference to the CD-SEM as an example. The CD-SEM is basically the same as the scanning electron microscope. The CD-SEM emits primary electrons from an electron gun and applies a voltage to the electrons to accelerate the electrons. Thereafter, a beam diameter of an electron beam is narrowed by an electromagnetic lens. The electron beam is two-dimensionally scanned on a sample such as a semiconductor wafer. Secondary electrons generated by incidence of the scanned electron beam on the sample are detected by a detector. The intensity of the secondary electrons reflects the shape of a sample surface. Therefore, a fine pattern on the sample can be imaged by displaying the scanning of the electron beam and the detection of the secondary electrons on a monitor in synchronization with each other. In the CD-SEM, for example, when line width of a gate electrode is measured, an edge of a pattern is discriminated on the basis of a change in light and shade of an obtained image to derive a dimension. The measurement principle of the CD-SEM is as explained above.

The CD-SEM is used for dimension measurement of a device pattern in a semiconductor manufacturing line. Therefore, not only performance of the electron microscope such as resolution and measurement length reproducibility but also throughput is extremely important. There are a plurality of factors that determine the throughput. Factors having particularly large influence are moving speed of a stage on which a wafer is loaded and time required for autofocus in acquiring an image. Examples of effective means for improving the two items include a change of the stage to an electrostatic chuck. That is, if the wafer can be stably fixed by the electrostatic chuck, the wafer can be conveyed at high acceleration and high speed without slipping down from the stage. The electrostatic chuck can planarize and fix the entire wafer surface including a warped wafer or the like with substantially equal force. Therefore, a height distribution in the wafer surface is equalized. Time for determining a current value fed to a coil of an objective lens to perform focusing, that is, an autofocus time is reduced.

On the other hand, a focus shift or the like is also caused by residual charges that occur when the wafer is arranged on the electrostatic chuck as explained above. Therefore, in order to remove the residual charges, it is desirable to periodically remove the residual charges accumulated on the electrostatic chuck using a method of irradiating an ultraviolet ray in a vacuum container and neutralizing electrostatic charge with ionized residual gas ion and electrons.

However, even if the charge removal is periodically carried out as explained above, the wafer surface potential on the electrostatic chuck fluctuates by the residual charges while the charge removal and the accumulation of electric charges are repeated. A focus blur occurs in an acquired image because of the fluctuation. The wafer surface potential is affected by not only the residual charges on the electrostatic chuck but also electrostatic charge of the wafer itself. Further, if electric charges remain on the electrostatic chuck, when the wafer is conveyed onto the electrostatic chuck, the electric charges are attracted by the residual charges on the electrostatic chuck and flow from a wafer supporting mechanism to the wafer. This also affects the wafer surface potential.

As another avoiding method, there is a method of applying a predetermined retarding voltage to a wafer actively rather than by floating to uniquely determine the potential of the wafer. However, even if it is attempted to directly apply the retarding voltage to the wafer, since the surface of the wafer is sometimes covered by an insulating film, it is difficult to attain conduction to all wafers. For example, even if a material sufficiently harder than the wafer such as conductive diamond is used and the tip of the material is sharpened to form a mechanism for breaking through an insulating film, conduction sometimes cannot be attained depending on the thickness of the insulating film. Even if conduction is attained, in the case of a mechanism that breaks through the wafer, it is likely that dust emission occurs when the wafer is broken through. The act of attaining conduction conceals electrostatic charge on the electrostatic chuck. Therefore, there is no means for learning an amount of electrostatic charge of the electrostatic chuck. The charge removal sometimes cannot be executed at appropriate timing.

In this embodiment, in a scanning electron microscope that holds a wafer with an electrostatic chuck and measures and analyzes a device on the wafer using an electron beam or acquires an image, a problem that occurs based on residual charges is solve by setting a surface potential sensor in a sample chamber, measuring a surface potential distribution of the wafer, and adjusting, for each measurement point, according to this distribution, an acceleration voltage for charged particles and/or a voltage applied to a sample.

According to this embodiment, it is possible to measure the surface potential of the wafer held on the electrostatic chuck. It is possible to suppress a focus blur by controlling an acceleration voltage to charged particles for each measurement point on the basis of a result of the measurement. It is possible to reduce time required for autofocus. It is possible to acquire an image without reducing throughput. It is possible to execute appropriate charge removal by monitoring an amount of electrostatic charge of the electrostatic chuck. Further, it is possible to improve reliability by checking charge removal of the electrostatic chuck during the charge removal execution.

A charged-particle beam device including an electrostatic chuck mechanism is explained below with reference to the drawings. First, an overview of a CD-SEM is explained with referenced to FIG. 1. The CD-SEM illustrated in FIG. 1 is mainly configured from an electron microscope column 101, a sample chamber 102, and a preliminary exhaust chamber 103 for evacuating the inside of the sample chamber 102 from the atmospheric pressure to vacuum.

An electrostatic chuck 105 is fixed on an X-Y stage 104 in the sample chamber 102 kept at high vacuum of $10^{-4}$ to $10^{-5}$ Pa. A wafer 106 is held on the electrostatic chuck. As the electrostatic chuck, there are roughly two types, i.e., an electrostatic chuck of a so-called Johnsen-Rahbeck type, specific resistivity of an dielectric film of which is approximately $1 \times 10^9$ Ω·cm to $1 \times 10^{12}$ Ω·cm, and an electrostatic chuck of a so-called coulomb type, specific resistivity of which is equal to or higher than the specific resistivity of the electrostatic chuck of the Johnsen-Rahbeck type. The respective electrostatic chuck types have characteristics. The present invention is effective for both the types. In the following explanation of this embodiment, the electrostatic chuck of the coulomb type excellent in stability of wafer potential because a leak current is substantially 0 and made of Al2O3 (aluminum oxide) suitable for a CD-SEM, in which potential stability during measurement is important, is applied to the CD-SEM.

In the sample chamber 102, a surface potential sensor 107 is set to keep a predetermined distance from the wafer. On the X-Y stage, a calibration table 108 at the same height as the wafer is disposed. A retarding voltage can be applied to the calibration table. With such a configuration, the retarding voltage on the calibration table is measured by the surface potential sensor in advance and, then, the retarding voltage is set as a calibration value, and the X-Y stage is scanned, whereby wafer surface potential on the electrostatic chuck can be learned. In this embodiment, the calibration table is disposed on the XY stage. However, the calibration table is not always limited to this and may be set in a position at the same height as the wafer separately from the stage. Potential for calibration applied to the calibration table should be selected as appropriate and should not be particularly limited.

Figure 2:
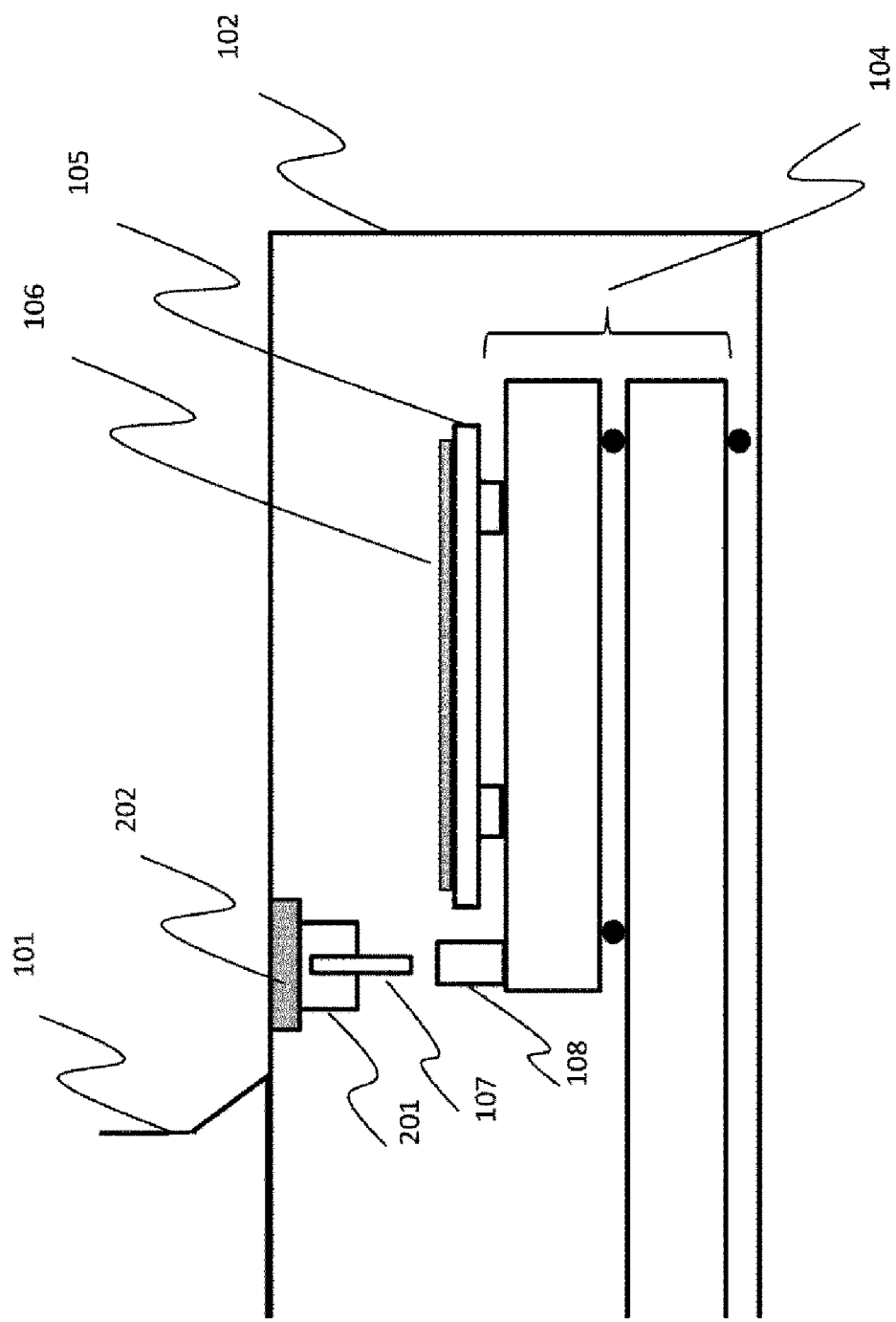
FIG. 2 is a diagram showing details of a potential sensor provided in the scanning electron microscope.

In FIG. 2, detailed characteristics of this embodiment are shown. In order to more accurately measure the surface potential of the wafer, the surface potential sensor 107 is held by a conductive fixing member 201 not to be affected by electrostatic charge of an insulating object around the surface potential sensor 107. The fixing member 201 is fixed to the sample chamber 102 via an insulating object 202 in order to keep insulation from a top plate. The surface potential sensor 107 is disposed on a straight line passing the wafer center and parallel to a stage X axis when the X-Y stage stands still in a wafer load position. The calibration table 108 is set in a position right under the surface potential sensor 107 when the X-Y stage stands still in the wafer load position.

With such a configuration, it is possible to learn wafer surface potential information on one straight line passing the wafer center by measuring, as a calibration value, the retarding voltage applied to the calibration table immediately after the wafer is carried into the sample chamber and thereafter operating the X-Y stage to move in the X direction. Usually, since the wafer can be regarded as a conductor, the surface potential of the wafer is fixed in the wafer surface. However, when the wafer itself is electrostatically charged, the surface potential is not fixed in the wafer surface. However, even in such a case, the electrostatic charge on the wafer is usually often distributed substantially axis-symmetrically with respect to the wafer center. Therefore, it is possible to learn the wafer surface potential as a function of a distance from the wafer center by scanning one straight line passing the center.

Note that, in this embodiment, the surface potential sensor and the calibration table are disposed in the X direction. However, the same effects are obtained when the surface potential sensor and the calibration table are disposed in the Y direction or an oblique direction.

Figure 3:
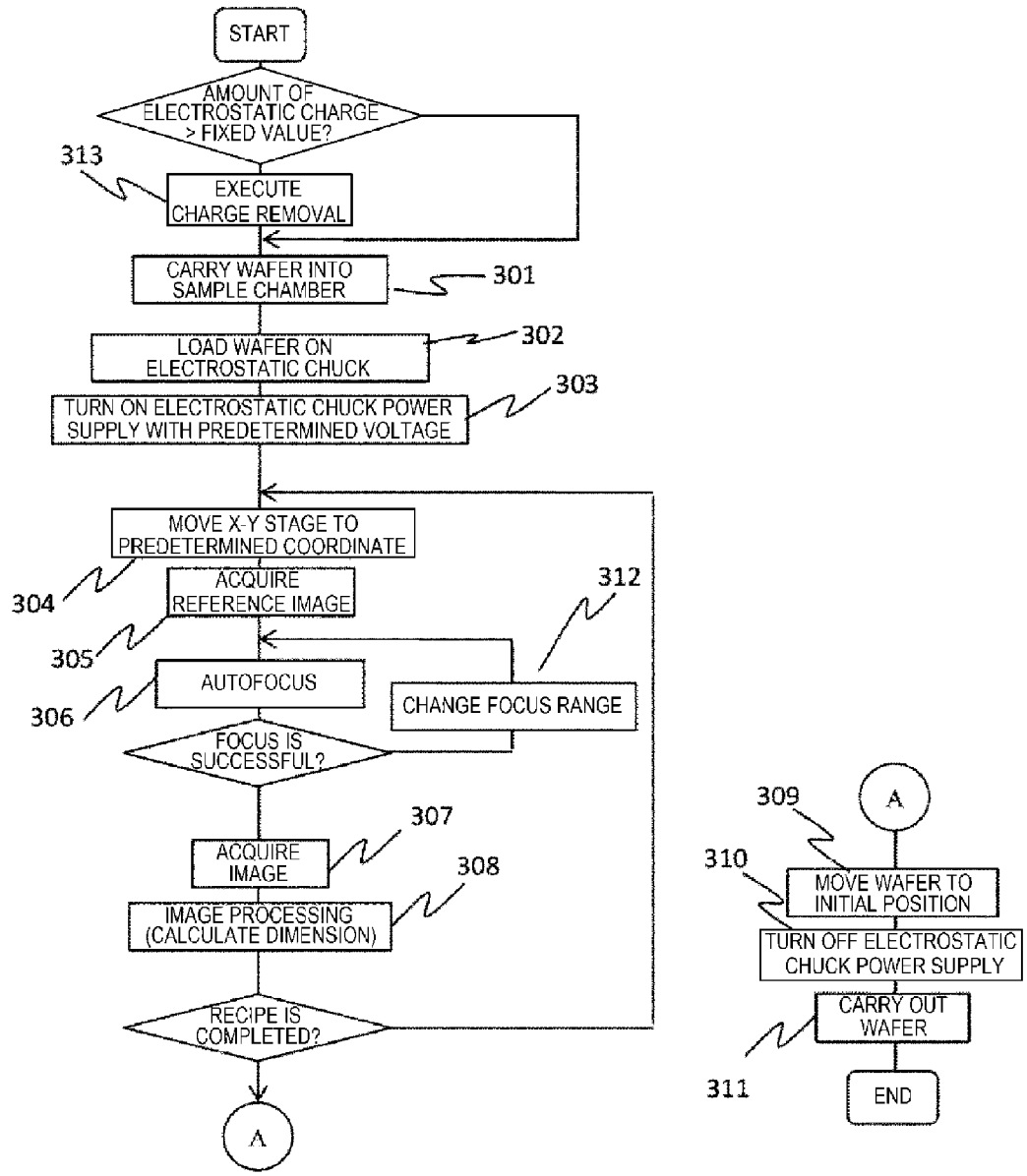
FIG. 3 is a flowchart for explaining an image acquisition process by the scanning electron microscope.
Figure 4:
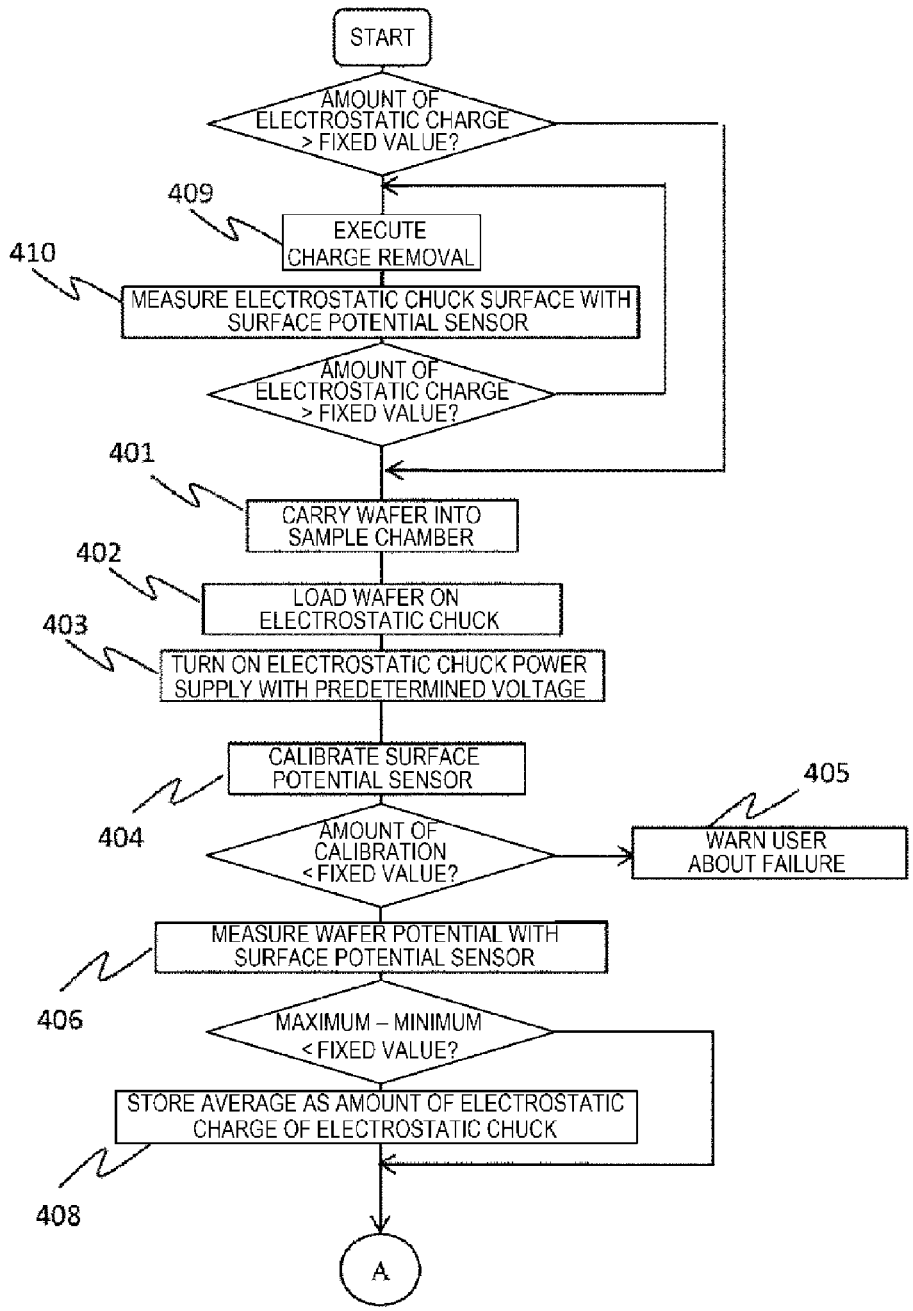
FIG. 4 is a flowchart (No. 1) for explaining a process for performing adjustment of device conditions of the scanning electron microscope and performing image acquisition on the basis of a potential measurement result by a potential meter obtained in a state in which attraction by an electrostatic chuck is performed in a sample chamber.
Figure 5:
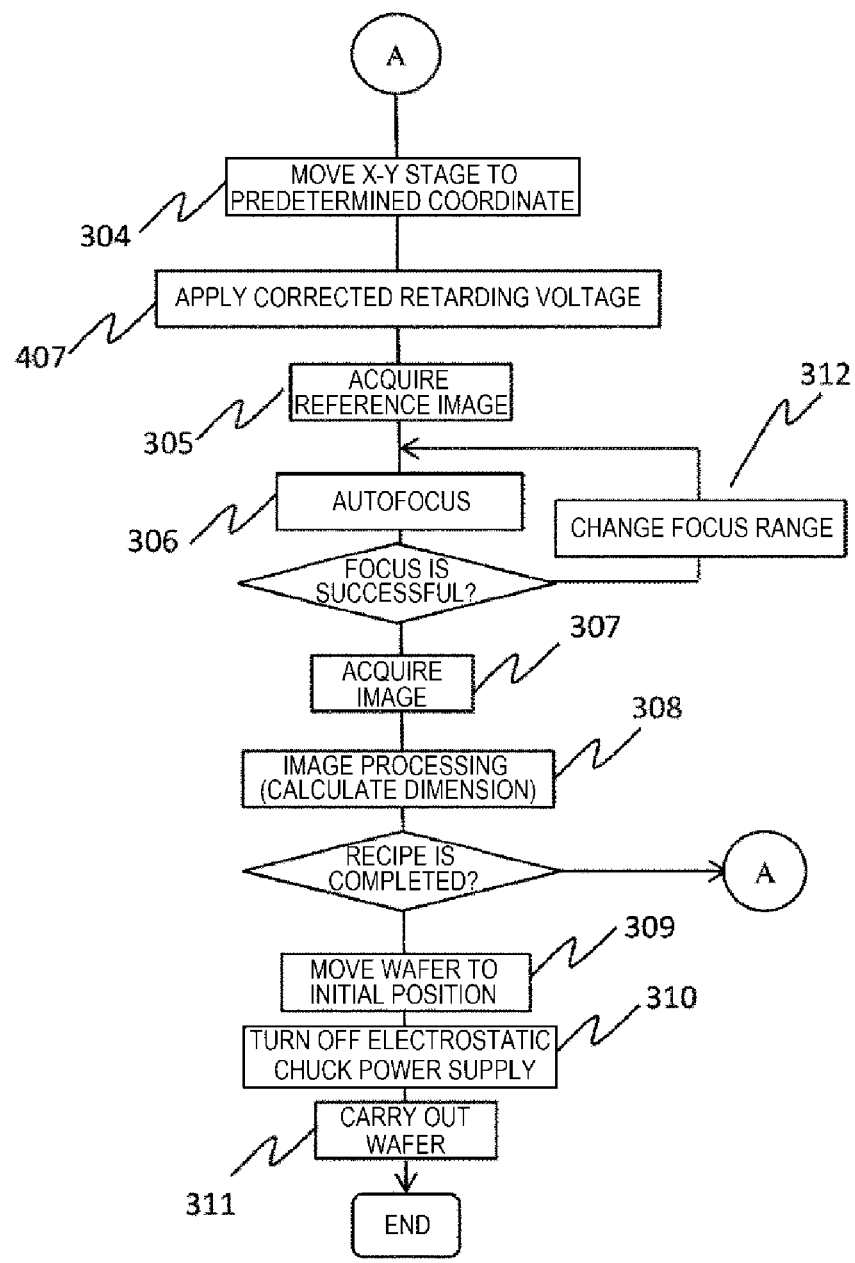
FIG. 5 is a flowchart (No. 2) for explaining the process for performing adjustment of device conditions of the scanning electron microscope and performing image acquisition on the basis of a potential measurement result by a potential meter obtained in a state in which attraction by an electrostatic chuck is performed in a sample chamber.

A measurement sequence by the CD-SEM using the configuration explained above is explained. FIG. 3 is an example of a flowchart in measuring a fine pattern on a wafer simply through a charge removing process. FIG. 4 and FIG. 5 are an example of a flowchart in measuring a fine pattern on a wafer through sample surface potential measurement after electrostatic attraction. First, the measurement flowchart in FIG. 3 is explained. A wafer is carried in by a not-shown conveying mechanism (301) and loaded on the electrostatic chuck (302). Subsequently, a voltage is applied to the electrostatic chuck by an electrostatic chuck power supply (303) to electrostatically attract the wafer. Subsequently, the X-Y stage is operated to move to a predetermined coordinate position such that a chip, which should be measured, on the wafer is located in an electron beam irradiation position (304).

When the movement to the predetermined position is completed, first, a reference image is acquired at low magnification (305). Subsequently, on the basis of the reference image, an electron beam is shifted to a place where measurement is desired to be performed. Autofocus is carried out at high magnification to adjust a focus of an image (306). The electron beam is scanned to acquire an image (307). Image processing is performed on the basis of the acquired image to calculate a target dimension (308). When a recipe set in advance is completed, the wafer is moved to the initial position together with the electrostatic chuck by the X-Y stage (309).

If the recipe is not completed and measurement and image acquisition of the next chip are performed, the X-Y stage is moved again to a predetermined coordinate of the next chip and measurement is repeated. When the electrostatic chuck moves to the initial position, power feed to the electrostatic chuck by a direct-current power supply is stopped (310). The electrostatic chuck carries the wafer to the outside of the device (311).

When there are a plurality of observation target wafers, this series of sequence is sequentially repeated for the plurality of wafers. When residual charges accumulate on the surface of the electrostatic chuck according to the repetition of contact and friction between the wafers and the electrostatic chuck, the surface potential on the wafers gradually shifts. When the surface potential on the wafer fluctuates, a focus blur occurs in an acquired reference image according to the fluctuation in the surface potential. A focus value adjusted by the autofocus also fluctuates. When a fluctuation amount of the surface potential is larger than a certain fixed value, the autofocus cannot follow the fluctuation in the surface potential and the focusing sometimes fails. When the focusing fails, a range in which the focus is swung is changed (312) and the autofocus is carried out again. However, time required for one measurement increases because the autofocus is carried out again. Device throughput is deteriorated. If an amount of electrostatic charge of the electrostatic chuck is larger than a fixed value, charge removal by ultraviolet ray irradiation is executed (313). If an amount of electrostatic charge is smaller than the fixed value, the wafer is carried in without executing the charge removal. The fixed value serving as a reference of this determination is set to a value of a degree that does not cause failure in the autofocus and does not cause deterioration in conveyance accuracy and an increase in foreign matter deposition, that is, a value with which the device can be stably operated even if the charge removal is not executed.

However, as explained above, the surface potential of the wafer depends on not only the amount of electrostatic charge of the electrostatic chuck but also the electrostatic charge of the wafer itself and a rear surface state of the wafer. Therefore, when an amount of electrostatic charge of the wafer itself is large or when an amount of electrostatic charge of the electrostatic chuck is large, fluctuation in the wafer surface potential increase. Even if the retarding voltage is corrected with respect to a wafer to be conveyed next making use of a value of the autofocus, a focus blur of the reference image and autofocus failure occur.

The measurement flowchart of FIG. 4 and FIG. 5 is explained. This flowchart has a characteristic that, when an observation target wafer is carried into the device, the surface potential of the wafer held on the electrostatic chuck is measured in advance and a retarding voltage is corrected for each measurement point on the basis of a measurement value. Note that measurement processing by the scanning electron microscope is executed by a not-shown control device.

First, a wafer is carried in by the not-shown conveying mechanism (401) and loaded on the electrostatic chuck (402). Subsequently, a voltage is applied to the electrostatic chuck by the electrostatic chuck power supply (403) to electrostatically attract the wafer. At this point, the surface potential sensor is disposed to be located right above a calibration pedestal. In a state in which a predetermined retarding voltage is applied to the calibration pedestal, the surface potential of the calibration pedestal is measured by the surface potential sensor and set as a calibration value (404). With respect to a value acquired as the calibration value, when an amount of calibration is larger than a predetermined amount, it is determined that the surface potential sensor is out of order and the device user is informed of the failure (405).

Consequently, it is possible to prevent the user from operating the device without noticing the failure. Subsequently, the X-Y stage is operated to move to the X direction and wafer surface potential on one straight line passing the wafer center is measured (406). A value of the surface potential obtained in this way is stored as a function of a distance from the wafer center. Every time the wafer moves to each measurement point, a retarding voltage corrected on the basis of a measurement value is applied (407). By adopting such a sequence, it is possible to perform appropriate surface potential correction for each measurement point. It is possible to prevent a focus blur and an autofocus failure of a reference image.

The wafer surface potential measured in this way is used for not only correction of the retarding voltage but also determination of timing when electrostatic charge of the electrostatic chuck is removed. Making use of the fact that an amount of electrostatic charge is not fixed in the wafer surface when the wafer itself is charged, the electrostatic charge is regarded as electrostatic charge of the wafer itself when a difference between a maximum and a minimum of obtained measurement values is larger than a predetermined value. Otherwise, an average of obtained measurement values is stored as an amount of electrostatic charge of the electrostatic chuck (408). If the amount of electrostatic charge of the electrostatic chuck is larger than a certain fixed value, charge removal by ultraviolet ray irradiation or the like is executed (409). If the amount of electrostatic charge is smaller than the certain fixed value, the wafer is carried in without executing the charge removal.

If the surface potential sensor is disposed as explained in this embodiment, it is possible to directly measure not only the wafer surface potential but also an amount of electrostatic charge of the electrostatic chuck itself. Therefore, the surface potential on the electrostatic chuck is measured in a state in which the wafer is absent after the charge removal is executed (410). It is determined whether the charge removal is correctly completed. When an amount of electrostatic charge on the electrostatic chuck is larger than a predetermined value, it is determined that the charge removal is incomplete. The charge removal sequence is executed again.

By periodically monitoring space potential in the sample chamber using the surface potential sensor, it is possible to monitor a state of electrostatic charge in the sample chamber different from states of electrostatic charge of the wafer and the electrostatic chuck. It is possible to learn in advance occurrence of harmful effects of the device affected by the electrostatic charge. It is possible to take measures before a problem is caused by charge removing means such as ultraviolet ray irradiation. It is possible to secure reliability of the device.

Note that, in this embodiment, the example is explained in which the surface potential on one straight line passing the wafer center is measured and stored as a function of a distance from the wafer center. However, the entire region in the wafer surface may be scanned to store and correct surface potential as an XY coordinate from the wafer center.

According to this embodiment, in the electron microscope applied with the electrostatic chuck, it is possible to correct wafer surface potential that takes account of all of residual charges on the electrostatic chuck accumulated during the device operation and electrostatic charge of the wafer itself or a conduction state of the wafer rear surface. It is possible to provide a scanning electron microscope that can continue to stably exhibit performance.

REFERENCE SIGNS LIST

101 Electron microscope column
102 Sample chamber
103 Preliminary exhaust chamber
104 X-Y stage
105 Electrostatic chuck
106 Wafer
107 Surface potential sensor
108 Calibration table
201 Fixing member
202 Insulating body

The invention claimed is:

1. A charged-particle beam device including an electrostatic chuck mechanism for holding a sample and a sample chamber in which the electrostatic chuck is set, the charged-particle beam device comprising:
a charged particle beam column that irradiates a charged particle beam on the sample;
a surface potential sensor that measures potential on a side of an attraction surface for the sample of the electrostatic chuck mechanism and is disposed closer to a side of the charged particle beam column than the sample; and
a control device that performs potential measurement by the surface potential sensor in a state in which the sample is attracted by the electrostatic chuck mechanism.

2. The charged-particle beam device according to claim 1, wherein a calibration pedestal to which a retarding voltage can be applied at same height as a wafer is set in a vacuum container.

3. The charged-particle beam device according to claim 1, wherein the surface potential sensor and a calibration pedestal are disposed in positions to be opposed to each other in a stage position in conveying a wafer into the sample chamber.

4. The charged-particle beam device according to claim 3, wherein the control device measures, with the surface potential sensor calibrated by the calibration pedestal, wafer surface potential on the electrostatic chuck, stores a measured value as a function of a distance from a wafer center, and corrects an acceleration voltage of charged particles at one or more measurement points.

5. The charged-particle beam device according to claim 1, further comprising a calibration pedestal to which a retarding voltage can be applied, and wherein the surface potential sensor calibrated by the calibration pedestal is used for a failure diagnosis according to whether an amount of calibration exceeds a predetermined amount.

6. The charged-particle beam device according to claim 1, further comprising a calibration pedestal to which a retarding voltage can be applied, and wherein the surface potential sensor measures an amount of electrostatic charge on the electrostatic chuck when charges on the electrostatic chuck are removed and the control device determines whether charge removal is correctly executed.

\* \* \* \* \*